United States Patent [19]
Entine et al.

[11] 3,962,669
[45] June 8, 1976

[54] ELECTRICAL CONTACT STRUCTURE FOR SEMICONDUCTOR BODY

[75] Inventors: Gerald Entine, Newton; Frank C. Wilson, Tewksbury, both of Mass.; Richard Farrell, East Killingly, Conn.

[73] Assignee: Tyco Laboratories, Inc., Waltham, Mass.

[22] Filed: July 24, 1974

[21] Appl. No.: 491,330

[52] U.S. Cl. .................................... 338/19; 338/15; 357/79
[51] Int. Cl.² ........................................ H01C 7/08
[58] Field of Search .............. 338/15, 18, 19, 324, 338/332; 357/79, 76, 29, 30; 250/211 R, 211 K; 339/147 R, 255 P

[56] References Cited
UNITED STATES PATENTS

| | | |
|---|---|---|
| 1,496,671 | 6/1924 | Gernsback ........................ 357/79 |
| 2,114,591 | 4/1938 | Clark ................................ 338/19 |
| 2,640,901 | 6/1953 | Kinman ............................ 338/324 |
| 3,188,594 | 6/1965 | Koller et al. ..................... 338/15 X |
| 3,238,425 | 3/1966 | Geyer ............................... 357/79 |
| 3,377,206 | 4/1968 | Hanlein et al. .................. 357/79 |
| 3,558,994 | 1/1971 | Bernstein ......................... 357/79 |
| 3,614,550 | 10/1971 | Marinace ......................... 357/79 |
| 3,697,825 | 10/1972 | Meuleman ....................... 357/79 |

*Primary Examiner*—C. L. Albritton
*Attorney, Agent, or Firm*—Schiller & Pandiscio

[57] ABSTRACT

An improved semiconductor device is described which utilizes stable, slow diffusing resilient contacts that also serve as a suspension support for a semiconductor body.

15 Claims, 5 Drawing Figures

ELECTRICAL CONTACT STRUCTURE FOR SEMICONDUCTOR BODY

This invention relates to semiconductor devices and more particularly to stable electrical contact structures for supporting such devices.

Many types of semiconductor devices are well known and include devices which are particularly useful as radiation detectors. These devices usually comprise a semiconductor body which provides an electrical output in response to some form of radiation input. Various types of semiconductive materials are known and are being developed for use in radiation detectors. By way of example, substantial research effort has been expanded in developing cadmium telluride photoconductor and photovoltaic devices for use at temperatures in the range of about 200°–500°C. More specifically, cadmium telluride has been found to be desirable as the sensing element of an aircraft engine fire detector operable at 400°C because of its relatively high resistivity and convenient spectral sensitivity. It has been determined that an optimal detector for the flame of burning jet fuel superimposed on a background of about 1,000°F would be insensitive to radiation of a wavelength above $1.2\mu$ and be most sensitive to radiation of wavelengths between $0.75\mu$ and $1.0\mu$. Cadmium telluride with a bandgap of 1.44 eV($0.85\mu$) at room temperature and of 1.25 eV($1.00\mu$) at 400°C provides the ideal spectral sensitivity.

However, semiconductor devices require stable, relatively slow diffusing contacts and this requirement has presented problems in the development of cadmium telluride semiconductor devices for use in high temperature applications. Referring to U.S. Pat. No. 3,721,938 issued to Entine et al., it is suggested therein that stable, relatively slow diffusing contacts for cadmium telluride devices can be achieved by depositing an iridium metal film having a thickness in the order of several hundred angstroms on the cadmium telluride crystal. The metal can be deposited on the crystal by electroplating, electroless plating, evaporation or sputtering. Terminal connections can then be made by depositing gold or silver filled epoxy films on the iridium metal and attaching wire leads to such films by state of the art techniques such as welding, soldering or securing them with a conductive cement.

These terminal connections however have proven inadequate since it has been discovered that the gold or silver in the epoxy films tends to diffuse through the intermediate iridium contact film into the cadmium telluride crystal and thus poison the semiconductive body. These mechanical electrical connections have further been proven inadequate for certain high temperature applications or when the detector is subjected to certain mechanical vibrations.

Another problem with these types of devices arises from the fact that cadmium telluride crystals are fragile and hence when attached directly to a substrate support of a different material having a different coefficient of thermal expansion the semiconductive bodies will have a tendency to fracture when expanding or contracting as a result of exposure to changes in temperature.

It is the primary object of the present invention, therefore, to provide terminal connections for semiconductor radiation detectors which substantially overcome the problems of the prior art.

This is accomplished by utilizing resilient electrical terminal contacts to support a semiconductive body.

Although metallic spring members have been used heretofore, as electrical terminals, particularly for testing cadmium telluride crystals for its photodetective behavior, it has been found that these previously known spring members are inadequate when subject to certain mechanical vibrations.

Other objects of the present invention are therefore: to provide an improved structure for electrically mounting semiconductor bodies to provide improved radiation detectors which are relatively easy to manufacture and assemble; to provide improved contacts for semiconductor bodies which will prevent the semiconductor material from being poisoned by high temperature diffusion; to provide a structure for electrically mounting semiconductive bodies which will prevent the semiconductor material from fracturing due to thermal expansion; to provide a structure for electrically mounting a semiconductive body which will provide relatively good electrical contact throughout its operating temperature range even while subjected to certain mechanical vibrations; and to provide contacts for semiconductive bodies which will provide a substantially low source of noise and yet will be as ohmic as possible throughout the intended operating temperature range.

These and other objects of the present invention are achieved by a semiconductor device comprising a semiconductor body and new and improved resilient, stable, slow diffusing electrical terminal contacts which engage and provide a spring suspension support for the semiconductor body.

Other features and advantages of the invention are described in or rendered obvious by the following detailed description which is to be considered together with the accompanying drawing wherein.

In the various figures of the drawing, like numerals refer to like parts.

Figure 1:
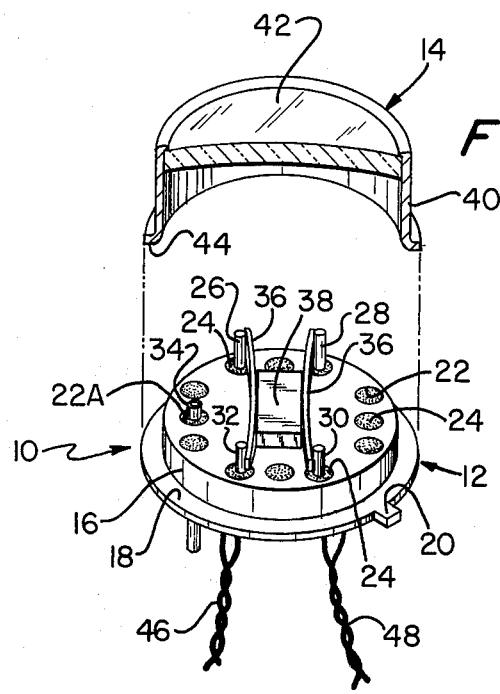
FIG. 1 is a partially exploded perspective view of a preferred embodiment of the present invention, with a portion thereof cut away for convenience of illustration.

The preferred embodiment herein illustrated and described, is a cadmium telluride semiconductor device which is particularly useful in high temperature applications, and more particularly, as an infrared photodetector. The semiconductor device, generally referred to at 10, comprises in part a header or mounting assembly 12 and a cap 14.

The header assembly 12 generally comprises a conventional header, generally referred to in the art as a "T08" header. Generally, a conventional T08 header comprises a base 16 which, for purposes as set forth herein, is in the shape of a disc having an annular shoulder 18 around its periphery. A locating tab 20 can be optionally provided at the edge of the base as a guide for mounting the assembled device 10 in any desired orientation. The base 16 is preferably made of a cobalt, iron, nickel alloy (such as an alloy commercially available under the trademark KOVAR) which is coated with gold. Typically, a T08 header also comprises twelve apertures 22. The latter extend longitudinally through the base 16 and are disposed around the periphery thereof in four groups of three, the apertures of each group being aligned with one another and forming one side of a square array.

Apertures 22 are provided for the purpose of mounting terminal leads to base 16 by means of a suitable electrically insulating material. In the preferred embodiment of this invention, the two end apertures 22 of each of two oppositely disposed groups of the square array are used as mounting holes for terminal leads 26, 28, 30 and 32. These leads are made of an electrically conductive material, and are preferably made of a cobalt, iron, nickel alloy, such as an alloy manufactured under the trademark KOVAR. The leads are hermetically sealed in place by a suitable sealing material 24 so that one end of each lead extends above the base a predetermined length to form a mounting pin. Sealing material 24 is preferably made of a glass frit composition of a type well known in the art which will bond well with the base 16 and terminal leads 28–32.

With the exception of one aperture 22A, the remaining apertures 22 are closed off by plugs of sealing material 24 bonded to base 16. Aperture 22A serves as a mounting hole for an evacuation tube 34. The latter is a hollow cylindrical tube which is centrally positioned aperture 22A and sealed in place by insulating material 24 so that one end of the tube extends above and the other end below the base 16. Tube 34 also is preferably made of a cobalt, iron, nickel alloy, such as the alloy manufactured under the trademark KOVAR.

Figure 2:
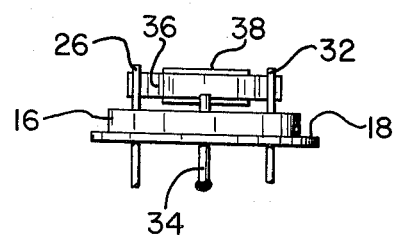
FIG. 2 is a side elevational view of the mounting assembly of the embodiment of FIG. 1.

Finally, the header assembly 12 includes the two resilient electrically conductive terminal strips 36. The latter are affixed to the mounting pins formed by the upper portions of leads 26, 28, 30 and 32. As shown, each strip is connected so as to extend generally along a chord of the circle defined by the outer surface of base 16. Thus, one of the strips is affixed to and extends between leads 28 and 30 while the other strip extends between leads 26 and 32. The strips are mounted to the leads under endwise compression, so that each strip has a slight curvature or bend when attached to the leads and so that the convex sides of the two curved strips face each other. The strips are preferably spot welded to the leads. As will become more apparent, the strips 36 are made of a resilient material so that they can be spread apart to receive the semiconductor body 38 and when released will coact to hold the body in place. As shown in FIGS. 1 and 2, the strips are arranged to engage and grip the body under a suitable pressure and also to suspend the body above the base 16 without being subjected to undue stress, particularaly under high temperature conditions, e.g., 400°C. The strips are preferably made of, or at least coated with, a contact material which has a very low diffusion rate with the particular material of the semiconductor body 38. In the preferred embodiment, where the semiconductor body is made from cadmium telluride, the contact strips are preferably made of iridium. It should be appreciated, however, that contact strips 36 may be made of or comprise other materials that may be suitable for use as contacts for cadmium telluride. For example, nickel has been found to be adequate. Furthermore, if the semiconductor body 38 is made of a material other than cadmium telluride, iridium and nickel may be unsatisfactory and, accordingly, the contact strips may be made of other conductive and resilient materials which do provide satisfactory results.

The semiconductor body 38 is preferably rectangular in shape as shown, and is sized so that its dimension measured transversely of and between strips 36 is greater than the minimum distance between the two strips in their as-mounted curved condition. The body 38 is mounted to header assembly 12 by spreading the two strips 36 apart, positioning the body therebetween so that it is spaced from the header base 16, and then releasing the strips so that they engage and are biased against the body. As such, the strips 36 provide good stable, relatively slow diffusion, electrical contacts.

The body 38 is preferably made of single crystal or polycrystalline cadmium telluride which is doped with either chlorine or indium, so that it has a good spectral response to radiation in the visible and near infrared region as well as the X-ray region of the electromagnetic spectrum. However, other materials have been found satisfactory where the device is used to detect other portions of the spectrum. For example, single crystal or polycrystalline zinc telluride doped with indium is resistant to heat up to 1000°F as well as being responsive to X-rays. It also responds well to energy in the visible portion of the electromagnetic spectrum. Thus, for example, such a zinc telluride body provided with contact films 37, as hereinafter described, can be mounted between iridium or nickel contact strips to provide a good photodetector which is particularly good for sensing visible light.

The body is made by first cutting a boule or ingot into chips of the approximate size desired. Preferably, the chips are then hand-lapped, polished and treated with an etching solution. Where the material of the body 38 is cadmium telluride or zinc telluride, the body is polished with alumina and treated with a methanol bromide etching solution.

Figure 5:
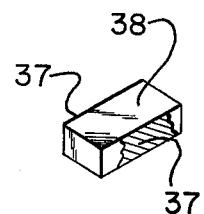
FIG. 5 is a perspective view of the semiconductive body of the FIG. 1 embodiment.
Figure 3:
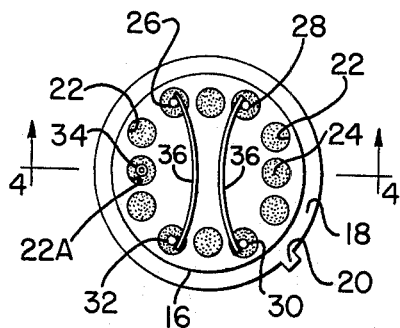
FIG. 3 is a plan view of the same mounting assembly.
Figure 4:
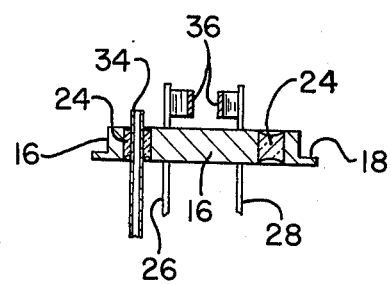
FIG. 4 is a cross-sectional elevational view taken along line 4—4 of FIG. 3.

The sides of the body 38 which are to contact the strips 36 are then coated with a slow diffusing, electrically conductive, contact film 37, as shown in FIG. 5 in accordance with the teachings of the above-mentioned U.S. Pat. No. 3,721,938. Preferably, the contact film is made of iridium, although other materials have also been found satisfactory such as nickel. Generally, either iridium or nickel can be used as contact film materials with either iridium or nickel strips 36 without poisoning a cadmium telluride or zinc telluride crystalline body.

After the body 38 has been suspended between the strips 36 in the manner herein described and illustrated, the assembly 12 is secured to the cap 14. The cap preferably comprises a cylindrical housing 40 which has a window or lens 42 mounted in one end thereof and is flared at the other end, so as to form a rim or flange 44. Housing 40 is preferably made of a cobalt, iron, nickel alloy, such as an alloy manufactured under the trademark KOVAR, and is preferably coated with gold. The window or lens 42 is preferably made from a material which is transparent to activating radiation (or to a selected portion of the frequency band of such radiation) to which the semiconductor body 38 is sensitive. Preferably also window 42 is substantially opaque to radiation which may be harmful to the body 38 or will have an adverse effect on the response of the device to the radiation that is to be detected. Thus, where the device is a cadmium telluride or zinc telluride photodetector which is to detect visible or near infrared energy the window is preferably made of glass which will transmit visible and near-infrared radiation and block ultraviolet light, while a beryllium plate is preferred to transmit X-rays and block the visible and infrared portion of the spectrum in a cadmium telluride or zinc telluride X-ray detector. The rim or flange 44 is shaped to closely engage shoulder 18, and a hermetic seal is made between flange 44 and shoulder 18 of the base 16. Cap 14 can be sealed to base 16 in any suitable manner known to persons skilled in the art, such as stitch welding or the like.

After cap 14 is sealed to base 16, the device is evacuated through evacuation tube 34, tested for hermeticity, and backfilled with forming gas to a pressure preferably of about 1.0 atmosphere. The forming gas is 5% $H_2$ and 95% $N_2$ by volume. However, other gases can be used. The device is then sealed by closing off tube 34. This may be accomplished by "flaming off" the tube, i.e., squeezing it under heat until it is welded to itself.

As well known in the art the resistivity of various semiconductor bodies may change when exposed to certain portions of the electromagnetic spectrum. Thus, by placing the strips 36 into contact with opposite sides of semiconductor body 38, a voltage potential differential created by a change in the resistivity can be detected between the contacts. The voltage potential differential is measured by electrically connecting each contact 36 with an electrical measuring circuit (not shown) of a type well known in the art. Since each of the contacts 36 of the present invention extend along an entire side of the body 38, the voltage potential differential can be reliably measured. Further, the arrangement provided by the strips 36 avoids increases in significant ohmic contact resistance between the strips 36 and the films 37 due to the large area of contact afforded by the strips 36. This reliability can be further insured by twisting together the portions of the two lead wires of each contact 36, which extend below the base 16 before electrically attaching them to the electrical measuring device. Thus, as shown in FIG. 1, the leads 26 and 28 are twisted together with the leads 32 and 30, respectively, so as to form two composite terminal leads 46 and 48. It has been found that twisting the wires together and tieing them down will also aid in preventing signal noise from being produced when the device is subjected to certain mechanical vibrations.

The assembled device thus provides a semiconductor device having stable, slow diffusing contacts which are easy to assemble. Cadmium telluride radiation detectors constructed as herein described and comprising the contact strips 36 made of iridium were found to have good signal behavior after aging at 400°C. At both room temperature and 400°C, these devices provided a signal-to-noise ratio, under the expected minimum flame illumination of $50\mu W/cm^2$, of approximately 20 to 1, with a bandwidth of over 1 KC. The output signal was found to be linearly related to the light intensity at all temperatures and did not saturate even at $4mW/cm^2$. However, the measured bias voltage exhibited linearity only above the temperature (180°C) where the junction effects of the cadmium telluride material disappear.

These devices were also subjected to certain dynamic vibrational testing wherein the devices were successively tested from 14Hz to 2000Hz at 20g sinusoidal vibration along three mutually perpendicular axes both at room temperature and at 400°C. The same cadmium telluride devices were also subjected to temperature cycling by cooling the devices down to −65°F with dry ice and then heated them to +75°F in an oven. The cycle was repeated ten times with no adverse effects on the operation of the device. Finally, those cadmium telluride devices tested passed successful life tests of over 1000 hours at 750°F without any significant deterioration of performance.

Since certain changes may be made in the above product, without departing from the scope of the invention herein involved, it is intended that all matter contained in the above description or shown in the accompanying drawing shall be interpreted in an illustrative and not in a limiting sense.

What is claimed is:

1. A device comprising:
   a body of semiconductive material having a pair of opposed surfaces, said surfaces being each provided with a film of electrically conductive material; and
   a mounting assembly including a base, at least two resilient spring electrically conductive contact members, and means attached to said contact members and said base for supporting said contact members in spaced relation to said base, said contact members being in spring biased contact with said opposed surfaces and providing stable, slow diffusion, electrical contact with said body.

2. A device in accordance with claim 2 wherein said last-mentioned means of said mounting assembly comprises at least two pairs of terminal leads, each pair of leads being connected to a different one of said contact members for electrically connecting said contact members to an electrical measuring circuit.

3. A device in accordance with claim 3 wherein the members of one of said pairs of leads are connected to opposite ends of one of said contact members and the members of the other pair of leads are connected to opposite ends of the other contact member.

4. A device in accordance with claim 1 further including an evacuation tube extending through said base.

5. A device in accordance with claim 1 further including a cap enclosing said body, said cap being hermetically sealed to said assembly.

6. A device in accordance with claim 5 wherein said cap includes a window which is transmissive to at least a portion of the electromagnetic spectrum to which said body is spectrally sensitive.

7. A device in accordance with claim 6 wherein said window is transmissive to at least a portion of the near infrared portion of said spectrum.

8. A device in accordance with claim 7 wherein said semiconductive material includes cadmium telluride and said spring contacts include iridium.

9. A device in accordance with claim 6 wherein said window is transmissive to at least a portion of the visible part of the electromagnetic spectrum.

10. A device in accordance with claim 9 wherein said semiconductive material comprises zinc telluride.

11. A device in accordance with claim 6 wherein said window is transmissive to at least a portion of the X-ray part of the electromagnetic spectrum.

12. A device in accordance with claim 1 wherein said semiconductive material includes cadmium telluride, said conductive material includes a metal selected from the group consisting of iridium and nickel, and said contact members include a metal selected from the group consisting of iridium and nickel.

13. A device in accordance with claim 1 wherein said semiconductive material includes zinc telluride, said conductive material includes a metal selected from the group consisting of iridium and nickel, and said contact members include a metal selected from the group consisting of iridium and nickel.

14. A device comprising:
a body of semiconductive material having a pair of opposed surfaces, said surfaces being each provided with a film of electrically conductive material; and
a mounting assembly including a base and two resilient spring electrically-conductive, curved metal strips which are spaced from said base and are adapted to engage said body under pressure, said strips being in spring biased contact with the films of electrically conductive material on said pair of opposed surfaces of said body and providing stable, slow diffusion, electrical contact therewith.

15. A device in accordance with claim 3, wherein a portion of the leads of each of said pair are connected together.

* * * * *

UNITED STATES PATENT OFFICE
CERTIFICATE OF CORRECTION

PATENT NO. : 3,962,669
DATED : June 8, 1976
INVENTOR(S) : Gerald Entine, Frank C. Wilson & Richard Farrell It is certified that error appears in the above-identified patent and that said Letters Patent are hereby corrected as shown below:

Claim 2, column 6, line 28, claim "2" should be claim "1".

Claim 3, column 6, line 34, claim "3" should be claim "2".

Signed and Sealed this

Seventeenth Day of August 1976

[SEAL]

Attest:

RUTH C. MASON
*Attesting Officer*

C. MARSHALL DANN
*Commissioner of Patents and Trademarks*